United States Patent
Tsujimoto et al.

(10) Patent No.: US 9,863,428 B2
(45) Date of Patent: Jan. 9, 2018

(54) FAN CONTROL UNIT AND POWER CONDITIONER

(71) Applicant: Sansha Electric Manufacturing Co., Ltd., Osaka (JP)

(72) Inventors: Keisuke Tsujimoto, Osaka (JP); Atsushi Makitani, Osaka (JP); Kazuhiro Nishikawa, Osaka (JP); Yuji Takamori, Osaka (JP)

(73) Assignee: Sansha Electric Manufacturing Co., Ltd., Osaka (JP)

( * ) Notice: Subject to any disclaimer, the term of this patent is extended or adjusted under 35 U.S.C. 154(b) by 430 days.

(21) Appl. No.: 14/438,866

(22) PCT Filed: Oct. 30, 2012

(86) PCT No.: PCT/JP2012/077965
§ 371 (c)(1),
(2) Date: Apr. 27, 2015

(87) PCT Pub. No.: WO2014/068651
PCT Pub. Date: May 8, 2014

(65) Prior Publication Data
US 2015/0285255 A1    Oct. 8, 2015

(51) Int. Cl.
*F04D 25/06* (2006.01)
*H02M 7/00* (2006.01)
(Continued)

(52) U.S. Cl.
CPC ........... *F04D 25/06* (2013.01); *F04D 19/002* (2013.01); *F04D 25/068* (2013.01);
(Continued)

(58) Field of Classification Search
CPC ...... F04D 25/06; F04D 25/068; F04D 19/002; F04D 27/004; F04D 29/5813;
(Continued)

(56) References Cited

U.S. PATENT DOCUMENTS 6,742,583 B2 * 6/2004 Tikka .................... H05K 7/206
165/261
6,877,551 B2 * 4/2005 Stoller .................. H02B 1/565
165/122
(Continued)

FOREIGN PATENT DOCUMENTS

JP    04-130697 A    5/1992
JP    H6-29194 U    4/1994
(Continued)

OTHER PUBLICATIONS

International Search Report for corresponding International Application No. PCT/JP2012/077965 dated Feb. 5, 2013.

*Primary Examiner* — Nathan Zollinger
(74) *Attorney, Agent, or Firm* — Renner Otto Boisselle & Sklar, LLP

(57) ABSTRACT

A fan control unit includes: an internal fan that is provided inside a casing, in which an inverter containing a switching element is disposed, and generates an air current for air-cooling inside the casing; a heat sink which is exposed inside a duct provided on the casing and to which the switching element is attached, the duct being provided with an air-intake port and an air-exhaust port; an air-intake fan disposed at the air-intake port of the duct; an air-exhaust fan disposed at the air-exhaust port of the duct; and a control section performing a control such that the air-exhaust fan is turned on earlier than the air-intake fan and the internal fan as output power increases, and that the internal fan and the air-intake fan are turned off earlier than the air-exhaust fan as output power decreases from a state in which all the fans are kept turned on.

7 Claims, 4 Drawing Sheets

(51) Int. Cl.
*H05K 7/20* (2006.01)
*F04D 19/00* (2006.01)
*F04D 27/00* (2006.01)
*F04D 29/58* (2006.01)

(52) U.S. Cl.
CPC ....... *F04D 27/004* (2013.01); *F04D 29/5813* (2013.01); *H02M 7/003* (2013.01); *H05K 7/206* (2013.01); *H05K 7/20918* (2013.01)

(58) Field of Classification Search
CPC .............. H02M 7/003; H05K 7/20136; H05K 7/20154; H05K 7/202; H05K 7/20945; H05K 7/206; H05K 7/20754; H05K 7/2089; H05K 7/209; H05K 7/20909; H05K 7/20918; H04Q 1/035; H04Q 1/11; H04Q 1/025; H04Q 1/026
USPC ........ 700/300; 361/704, 165, 185; 165/80.2, 165/80.3, 80.4, 275, 281, 285, 287, 47, 165/120, 59
See application file for complete search history.

(56) References Cited

U.S. PATENT DOCUMENTS

| | | | | |
|---|---|---|---|---|
| 7,589,963 B2 * | 9/2009 | Petruzzi | ................ | G06F 1/181 361/679.51 |
| 7,729,115 B2 * | 6/2010 | Hall | ................ | H05K 7/20918 165/183 |
| 8,565,933 B2 * | 10/2013 | Nielsen | ................ | G06F 1/206 700/275 |
| 9,010,129 B2 * | 4/2015 | Lilke | ................ | F24F 5/0042 62/3.2 |
| 9,229,498 B2 * | 1/2016 | Chen | ................ | G06F 1/20 |
| 9,545,037 B2 * | 1/2017 | Tyleshevski | ........ | H05K 7/20909 |
| 9,585,293 B2 * | 2/2017 | Yamanaka | .......... | H05K 7/20918 |
| 2006/0243423 A1 * | 11/2006 | Giacoma | ................ | F28D 9/00 165/104.14 |
| 2014/0138068 A1 * | 5/2014 | Nienberg | ........... | H05K 7/20909 165/121 |
| 2015/0022972 A1 * | 1/2015 | Kwon, II | ................ | F24F 7/007 361/690 |
| 2015/0285255 A1 * | 10/2015 | Tsujimoto | ............. | H02M 7/003 417/44.1 |
| 2015/0305197 A1 * | 10/2015 | King | ...................... | H05K 7/207 361/695 |

FOREIGN PATENT DOCUMENTS

| | | |
|---|---|---|
| JP | 2001-025254 A | 1/2001 |
| JP | 2004-087711 A | 3/2004 |
| JP | 2004-088023 A | 3/2004 |
| JP | 2005-348533 A | 12/2005 |
| JP | 2007-267478 A | 10/2007 |
| JP | 2010-124009 A | 6/2010 |
| JP | 2011-035968 A | 2/2011 |
| JP | 2012-009636 A | 1/2012 |
| JP | 2012-204715 A | 10/2012 |

* cited by examiner

FAN CONTROL UNIT AND POWER CONDITIONER

TECHNICAL FIELD

The present invention relates to a fan control unit that is applicable to inverters and the like, and to a power conditioner using the same.

BACKGROUND ART

In a power conditioner or the like that is disposed between a power generator such as solar photovoltaic power generator or the like and a system power supply (system), a fan control unit containing an air-cooling fan and a control section thereof is provided, together with an inverter. While in the power conditioner, DC power generated by the power generator is converted into AC power and then the AC power is outputted to the system, the power generated usually varies in time. In particular, in a case where the power generator is a solar photovoltaic power generator, the power generated changes considerably, depending on weather conditions and time of day. Since heat generated by the internal inverter or the like changes when the power generated varies, in a case where an air-cooling fan is kept turned on all the time, the air-cooling by the fan becomes excessive during the time when the heat generated is little, which results in wasteful power consumption.

Then, there has become known a prior art apparatus in which the number of air-cooling devices that are turned on is controlled among a plurality of the air-cooling devices provided, depending on the power generated, thereby achieving an adequate cooling capability that depends on the heat generated (Patent Literature 1).

CITATION LIST

Patent Literature

Patent Literature 1: Japanese Patent Unexamined Publication No. 2011-035968 bulletin

SUMMARY OF INVENTION

Technical Problem

However, in the above-mentioned apparatus, because an air current flowing inside a casing is dispersed although part of the air current comes into direct contact with an inverter section which is the element subjected to a large temperature rise, passage loss is too large to enhance the cooling effect on the inverter section.

The present invention is directed to providing, apart from an internal fan, a fan control unit capable of performing an effective cooling of an inverter section of which temperature rise is large, and a power conditioner using the same.

The present invention is also directed to providing a fan control unit capable of improving energy utilization efficiency in which power consumption for cooling is taken into consideration, and a power conditioner using the same.

Solution to Problem

A fan control unit of the present invention includes: an internal fan that is provided inside a casing, in which an inverter containing a switching element is disposed, and generates an air current for air-cooling inside the casing; a heat sink which is exposed inside a duct and to which the switching element is attached, the duct being provided on an outer periphery of the casing, the duct being provided with an air-intake port and an air-exhaust port;

an air-intake fan disposed at the air-intake port of the duct;

an air-exhaust fan disposed at the air-exhaust port of the duct; and a control section for controlling the internal fan, the air-intake fan and the air-exhaust fan depending on output power of the inverter, wherein the control section causes the air-exhaust fan to be turned on earlier than causing the air-intake fan and the internal fan to be turned on as the output power increases, and causes the internal fan and the air-intake fan to be turned off earlier than causing the air-exhaust fan to be turned off as the output power decreases from a state in which all of the internal fan, the air-intake fan and the air-exhaust fan are kept turned on.

With a structure such that the air-intake fan and the air-exhaust fan are disposed inside the duct, the air current for cooling generated by these fans is used only for cooling the heat sink of which temperature rise is the largest. Moreover, at the time when the output power increases, the control section is configured to start off turning on the fans with the air-exhaust fan that has an excellent cooling effect. Conversely, at the time when the output power decreases, the control section performs an on-off control of the fans so that the air-exhaust fan is turned off last. This ensures that cooling of the heat sink, i.e., cooling of the inverter, is performed effectively, and that wasteful power consumption is prevented from occurring thanks to the on-off control of the fans performed so as to enhance the cooling efficiency at the times when the output power increases and decreases.

In the present invention, the control section may have the on-off control of the fans given a hysteresis property. In a hysteresis control, the control section performs a control such that magnitude of the output power at the time when each of the air-exhaust fan, the air-intake fan and the internal fan is turned off is less than magnitude of the output power at the time when each of the air-exhaust fan, the air-intake fan and the internal fan is turned on, respectively.

Despite the fact that, due to certain heat contents the heat sink and/or other cooling objects have, their temperature fall occurs later than the output power decrease, the above-mentioned hysteresis control allows for eliminating occurrences of the possibility that the control section might cause the fans to be turned off even in a state of the temperature being still high when the output power decreases.

In the present invention, the duct is disposed in such a manner as to cover a top face and a rear face of the casing entirely.

Such a configuration permits the duct by itself to serve as a means for protecting the casing from water and dust, thereby allowing for facilitating countermeasures against water and dust.

Advantageous Effects of Invention

The present invention makes it possible to perform an effective cooling of a heat sink of which temperature rise is large thanks to a structure of a duct, and to improve an energy utilization efficiency by taking power consumption for cooling into consideration.

DESCRIPTION OF EMBODIMENTS

Figure 1:
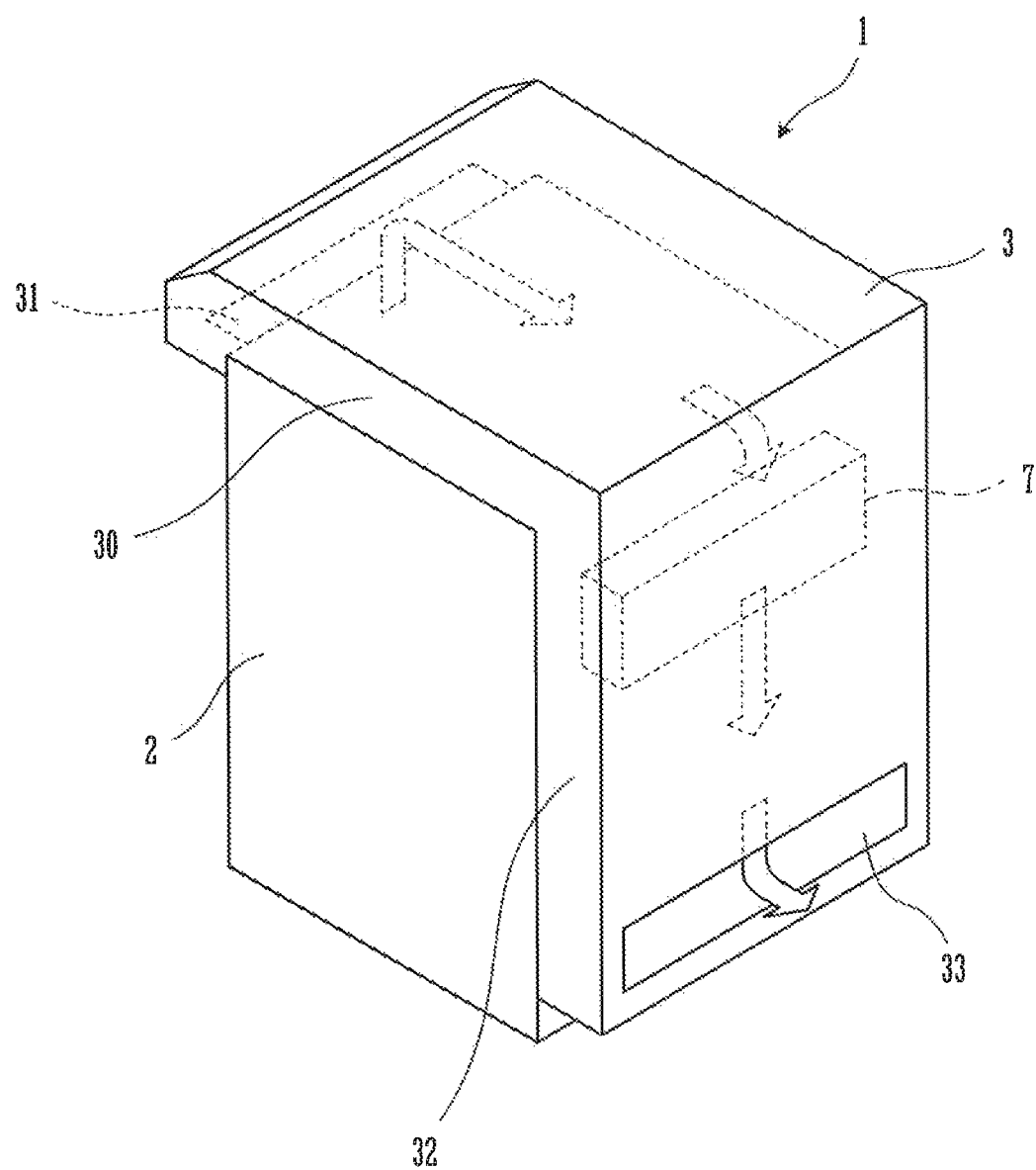
FIG. 1 is an external view of a power conditioner according to an embodiment of the present invention.

FIG. 1 is an external view of a power conditioner according to an embodiment of the present invention.

A power conditioner 1 is connected to a solar photovoltaic power generator which is not shown and to a commercial system power supply (system) in between, and has a function of outputting power generated by the solar photovoltaic power generator to the system. The power conditioner 1 includes: a main body section 2 provided with an inverter for converting DC power generated by the solar photovoltaic power generator into AC power and a control section for performing various controls; and a duct 3 that is provided in such a manner as to cover a top face and a rear face (right-side face in the Figure) of a casing of the main body section 2 entirely.

The duct 3 as a whole is L-shaped, and is provided with an air-intake port 31 of a slightly larger rectangular shape that opens, when viewed from the front, downward at an end portion located on the left side of a horizontally disposed upper limb section 30, and an air-exhaust port 33 of a slightly larger rectangular shape that opens, when viewed from the front, toward the right side at an end portion located at a lowermost portion of a vertically disposed vertical limb section 32, respectively. As described below, inside the duct 3 are provided, an air-intake fan 13 near the air-intake port 31 (refer to FIG. 2), and an air-exhaust fan 12 near the air-exhaust port 33 (refer to FIG. 2), respectively. As to the air-intake fan 13 and the air-exhaust fan 12, 6 pieces of the air-intake fans 13 and 6 pieces of the air-exhaust fans 12 are disposed along a width direction of the duct 3, and are controlled so that each 6 pieces thereof are turned on and turned off synchronously, respectively, so as to achieve a uniform air current inside the duct 3 that is extending in the width direction. Directions of the air current flowing inside the duct 3 are as shown by the arrows in the same Figure.

At the vertical limb section 32 of the duct 3, a heat sink 7, mentioned below, is disposed in such a manner as to be exposed inside the duct 3 at a portion located above the above-mentioned air-exhaust fan 12. The heat sink 7, which is attached to a switching element of the inverter that is provided inside the main body section 2, has a function of transferring and dissipating heat generated by the switching element to the surroundings. Hence disposing the heat sink 7 in the above-mentioned air current makes it possible to cool the heat sink 7 directly, and thus to enhance the heat dissipation effect remarkably.

As shown in FIG. 1, since the duct 3 is provided in such a manner as to cover the top face and the rear face of the casing of the main body section 2 entirely, the covered part of the main body is given protection against water and dust.

Likewise, since the air-intake port 31 opens downward, entering of waterdrop(s) and/or the like from the opening can be prevented. In particular, waterdrop(s) and/or dust, if entering into the main body section 2 in which the switching element, the control section and so forth are disposed, can cause a failure; however, this sort of problem will not occur, since, in this embodiment, the main section 2 is hermetically sealed from outside, and the heat sink 7 provided in such a manner as to be exposed inside the duct 3, the air-exhaust fans and the air-intake fans are the only ones that are exposed to the ambient air.

Figure 2:
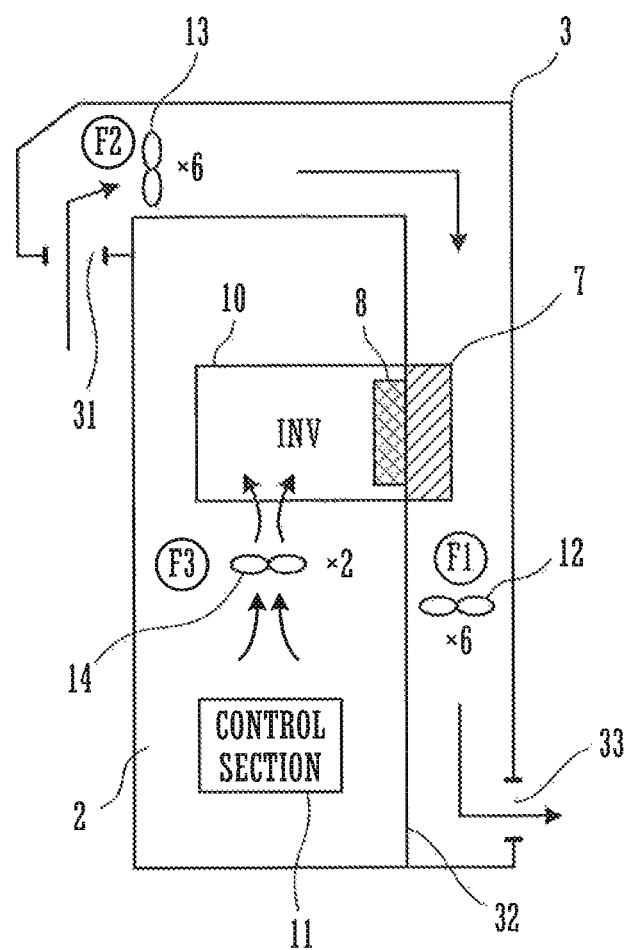
FIG. 2 is a schematic diagram of a fan control unit.

FIG. 2 is a schematic diagram of a fan control unit that is provided in the power conditioner 1.

The fan control unit includes: the duct 3; the air-exhaust fan 12 provided near the air-exhaust port 33 of the duct 3; the air-intake fan 13 provided near the air-intake port 31 of the duct 3; an internal fan 14 provided in the neighborhood of the inverter 10 inside the main body section 2; and the control section 11 for performing various controls of the power conditioner 1. The inverter 10 includes: the switching element 8 such as IGBT and/or the like; and the heat sink 7 that is attached to the switching element 8, and the heat sink 7 is exposed inside the duct 3 at a rear face section 32 thereof so as to be located above the air-exhaust fan 12. The air-exhaust fans 12 and the air-intake fans 13 include, as mentioned above, 6 pieces of fans, respectively, and the respective 6 pieces of fans are disposed along the width direction of the duct so that the air current flows in the directions as shown by the arrows in the Figure.

As shown in FIG. 1 and FIG. 2, the air current produced by the air-exhaust fans 12 and the air-intake fans 13 when they are turned on has no passages but one for the heat sink 7; so that passage loss of the air current is extremely small. Therefore, cooling effect achievable with these fans 12, 13 is very large. The internal fans 14 are used to agitate the air inside the hermetically sealed main body section 2, and thus to prevent local stagnation of heat from occurring.

Further, the cooling effect achievable with the air-exhaust fan 12 is larger than the cooling effect achievable with the air-intake fan 13. The reason for this is that the heat dissipation effect by the air-exhaust fan 12, which is disposed between the heat sink 7 and the air-exhaust port 33, is larger than that by the air-intake fan 13, of which distance to the air-exhaust port 33 is longer.

Figure 3:
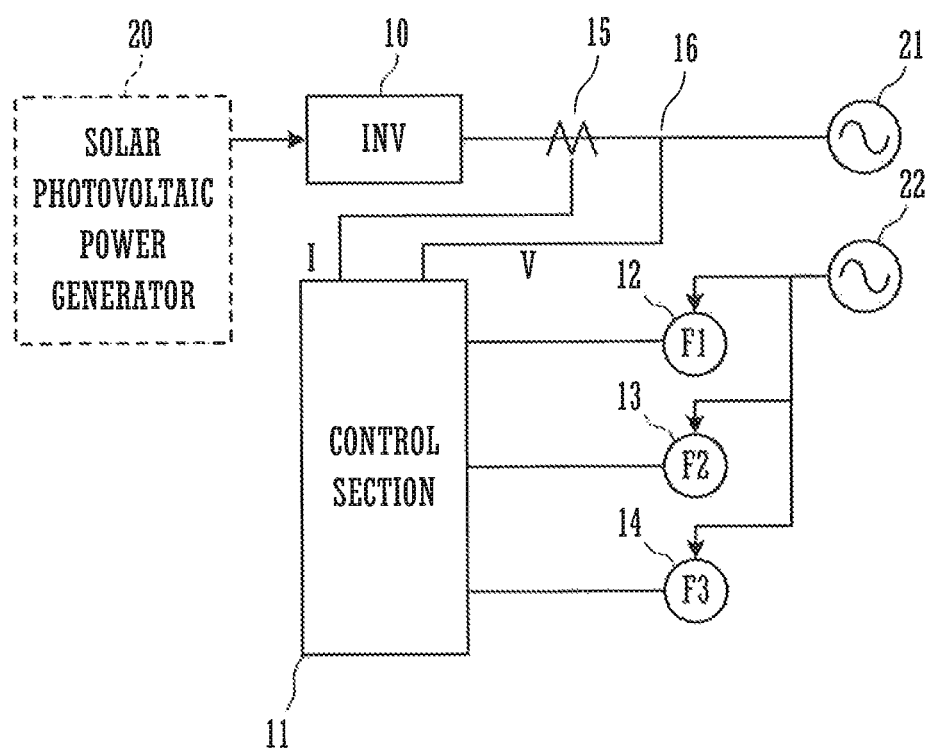
FIG. 3 is a functional block diagram of the power conditioner.

FIG. 3 is a functional block diagram of the power conditioner 1.

The power conditioner 1 includes the inverter 10 and the control section 11; and to the control section 11 is connected circuits such as relays, electromagnetic contactors and so forth for driving the air-exhaust fan 12, the air-intake fan 13 and the internal fan 14. To the inverter 10 are connected the solar photovoltaic power generator 20 and a system 21 (3-phase power system), and the power generated by the solar photovoltaic power generator 20, after being converted from DC to AC, is outputted to the system 21. The air-exhaust fan 12, the air-intake fan 13 and the internal fan 14 are driven by the power from a system 22 (single-phase power system). The control section 11 detects, using a current sensor 15 and a voltage sensor 16, an output current and an output voltage from the inverter 10, calculates output power from those detected values, and performs the on-off control of the respective fans depending on the magnitude of the output power.

In the following, the on-off control of the respective fans performed by the control section is explained, referring to FIG. 4.

Figure 4:
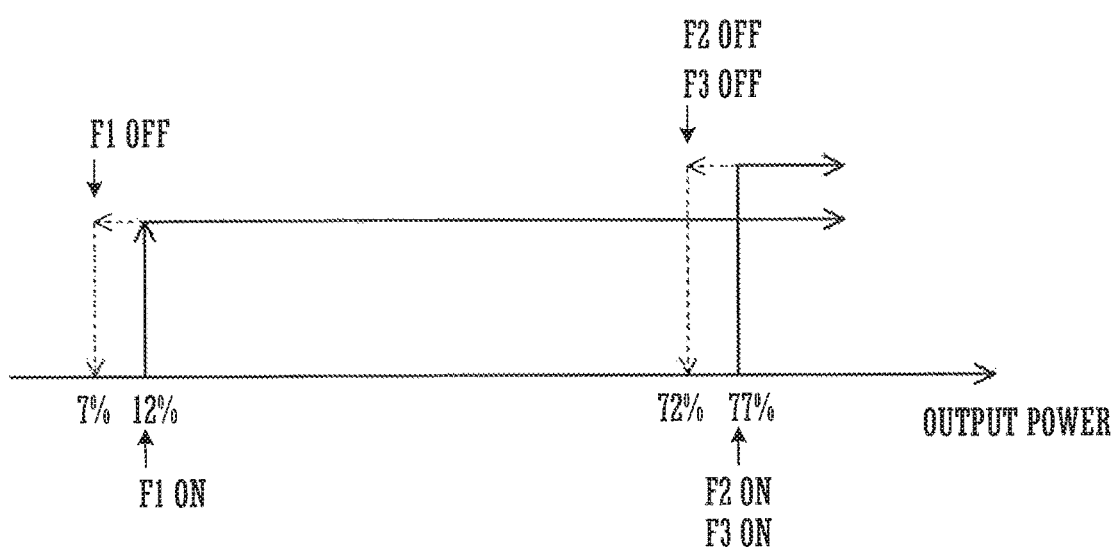
FIG. 4 is a diagram showing on-off sequences for respective fans.

FIG. 4 shows on-off sequences for the respective fans, with the magnitude of the output power being set to abscissa.

Conditions for the on-off of the respective fans in the sequences are as follows:

(1) Conditions for off-to-on transitions of the respective fans (A) air-exhaust fan 12: to be turned on when the output power exceeds 12% of the rated value.

(B) air-intake fan 13: to be turned on when the output power exceeds 77% of the rated value.

(C) internal fan 14: to be turned on when the output power exceeds 77% of the rated value.

(2) Conditions for on-to-off transitions of the respective fans (D) air-exhaust fan 12: to be turned off 3 minutes later from when the output power falls below 7% of the rated value.

(E) air-intake fan 13: to be turned off 3 minutes later from when the output power falls below 72% of the rated value.

(F) internal fan 14: to be turned off 3 minutes later from when the output power falls below 72% of the rated value.

When the magnitude of the output power is from the neighborhood of 10% of the rated value to around 70% of the rated value, cooling off of heat generated by the inverter 10 can be achieved by the air-exhaust fan 12. Hence, inside the duct 3, only the air-exhaust fan that has the largest heat dissipation effect is turned on as described in (A) above. Within this range of the magnitude, driving power for the air-intake fan 13 and the air-exhaust fan 14 is not required.

When the output power becomes not less than around 80% of the rating, the amount of heat generated by the inverter becomes large. Hence, in this state, the air-intake fan 13 and the internal fan 14 are additionally turned on as described in (B), (C) above.

On the other hand, when the output power decreases from in the state of not less than around 80% of the rated value to around 70% of the rated value, the amount of heat generated by the inverter 10 becomes less; so that the air-intake fan 13 and the internal fan 14 are turned off. Even so, however, due to heat contents the heat sink 7 and internal components possess, the temperature as a whole still remains high for a while. Therefore, by employing hysteresis to the sequences, the magnitude of the output power at which these fans are turned off is slightly lowered. To put it in words of the above example, whereas the off-to-on transitions of these fans 13, 14 are set to occur at the time when the output power exceeds 77% of the rated value, the on-to-off transitions of the fans 13, 14 are set to occur at the time when the output power falls below 72% of the rated value. Further, 3 minutes of delay is employed as an adjustment time for the on-to-off transitions.

When the output power decreases to the neighborhood of 10% of the rated value, the amount of heat generated by the inverter 10 becomes less; so that the air-exhaust fan 12 is also turned off. Even so, however, due to the heat contents the heat sink 7 and internal components possess, the temperature as a whole still remains high for a while. Therefore, as mentioned above, by employing hysteresis to the sequence, the magnitude of the output power at which the air-exhaust fan 12 is turned off is slightly lowered. To put it in words of the above example, whereas the off-to-on transition of the air-exhaust fan 12 is set to occur at the time when the output power exceeds 12% of the rated value, the on-to-off transition of the air-exhaust fan 12 is set to occur at the time when the output power falls below 7% of the rated value. Further, 3 minutes of delay is employed as an adjustment time for the on-to-off transition.

Additionally, the above-mentioned set values of 7%, 12%, 72%, 77%, and the 3 minutes of delay as the adjustment time can be set to other values discretionally. Effective sequences in this embodiment are first to turn on the air-exhaust fan 12 that has the largest cooling effect when the output power increases, and subsequently to turn on the air-intake fan 13 and the internal fan 14 when the output power increases further up to the neighborhood of the rated value. As mentioned above, inside the duct 3, since the air-exhaust fan 12 is disposed below the heat sink 7 and the air-intake fan 13 is disposed near the air-intake port 31 of the duct 3, it is considered that the heat dissipation effect for the heat sink 7 by the air-exhaust fan 12 is comparatively larger than that by the other. Hence the above-mentioned sequences are chosen.

Energy utilization efficiency of power conditioners is represented by the following expression:

$$Pout/(Pin+Pc) \times 100\%$$

where Pout denotes AC output power of a power conditioner, Pin denotes DC input power, and Pc denotes power for a control power supply that includes driving power for the fans which is inputted from the system, respectively.

Since, from the expression above, the energy utilization efficiency becomes higher the smaller Pc is, the overall efficiency becomes higher with a method of control by means of the above-mentioned sequences as compared with a method of driving the fans without regard to the output power.

As explained above, due to the fact that the fans used are located at 3 different positions, and that the on-off control of the respective fans are performed depending on the magnitude of the output power, it is made possible to perform a control of turning on only the fan(s) required for the amount of heat to be dissipated, and thus to prevent wasteful power consumption, thereby increasing the energy utilization efficiency as a whole.

As a variation of the embodiment, number(s) of the respective fans 12, 13 that are turned on may be controlled depending on the magnitude of the output power. To put it in words of the above example, for instance, in (A), from the time when the output power exceeds 12% of the rated value, the number of the air-exhaust fans 12 which are turned on is increased stepwise as the output power becomes larger. Then, in (D), from the time when the output power falls below 72% of the rated value, the number of the air-exhaust fans 12 that are kept turned on is decreased stepwise as the output power becomes less; and 3 minutes later from the time when the output power falls below 7% of the rated value, the air-exhaust fan 12, which is the last one, is turned off. Similar control may be employed to the air-intake fans 13. Such a control permits more meticulous control of heat dissipation. Further still, it may be acceptable that the air-exhaust fans 12, the air-intake fans 13, and the internal fans 14 are turned on in this order as the output power increases, and that the internal fans 14, the air-intake fans 13, and the air-exhaust fans 12 are turned off in this order as the output power decreases.

REFERENCE SIGNS LIST

1 power conditioner
2 main body section
3 duct
10 inverter
11 control section
12 air-exhaust fan
13 air-intake fan
14 internal fan

The invention claimed is:
1. A fan control unit comprising:
an internal fan that is provided inside a casing, in which an inverter containing a switching element is disposed, and generates an air current for air-cooling inside the casing;

a heat sink which is exposed inside a duct and to which the switching element is attached, the duct being provided on an outer periphery of the casing, the duct being provided with an air-intake port and an air-exhaust port;

an air-intake fan disposed at the air-intake port of the duct;

an air-exhaust fan disposed at the air-exhaust port of the duct; and a control section for controlling the internal fan, the air-intake fan and the air-exhaust fan depending on output power of the inverter, wherein the control section causes the air-exhaust fan to be turned on earlier than causing the air-intake fan and the internal fan to be turned on as the output power increases, and causes the internal fan and the air-intake fan to be turned off earlier than causing the air-exhaust fan to be turned off as the output power decreases from a state in which all of the internal fan, the air-intake fan and the air-exhaust fan are kept turned on.

2. The fan control unit according to claim 1, wherein the control section performs a control such that magnitude of the output power at the time when each of the air-exhaust fan, the air-intake fan and the internal fan is turned off is less than magnitude of the output power at the time when each of the air-exhaust fan, the air-intake fan and the internal fan is turned on, respectively.

3. The fan control unit according to claim 1, wherein the duct is disposed in such a manner as to cover a top face and a rear face of the casing entirely.

4. A power conditioner comprising the fan control unit according to claim 1 and the casing, wherein the power conditioner converts generated power inputted from outside into AC power with the inverter and outputs the AC power to a system power supply.

5. The fan control unit according to claim 2, wherein the duct is disposed in such a manner as to cover a top face and a rear face of the casing entirely.

6. A power conditioner comprising the fan control unit according to claim 2 and the casing, wherein the power conditioner converts generated power inputted from outside into AC power with the inverter and outputs the AC power to a system power supply.

7. A power conditioner comprising the fan control unit according to claim 3 and the casing, wherein the power conditioner converts generated power inputted from outside into AC power with the inverter and outputs the AC power to a system power supply.

* * * * *